United States Patent [19]
Richter

[11] Patent Number: 4,760,639
[45] Date of Patent: Aug. 2, 1988

[54] APPARATUS FOR EQUIPPING CIRCUIT BOARDS

[75] Inventor: Martin Richter, Marloffstein, Fed. Rep. of Germany

[73] Assignee: Siemens Aktiengesellschaft, Berlin and Munich, Fed. Rep. of Germany

[21] Appl. No.: 899,176

[22] Filed: Aug. 21, 1986

[30] Foreign Application Priority Data

Aug. 26, 1985 [DE] Fed. Rep. of Germany ....... 3530452

[51] Int. Cl.$^4$ .............................................. H05K 3/30
[52] U.S. Cl. .................... 29/566.3; 29/707; 29/741; 29/838; 227/1; 227/7
[58] Field of Search ............... 29/33 M, 749, 564.8, 29/566.3, 566.2, 566.1, 705, 706, 707, 708, 714, 720, 741, 838, 837, 753; 279/1 TS; 227/1, 7, 79, 90

[56] References Cited

U.S. PATENT DOCUMENTS

| | | | |
|---|---|---|---|
| 3,858,892 | 1/1975 | Rutschke et al. | 279/1 TS |
| 4,309,808 | 1/1982 | Dean et al. | 29/566.3 |
| 4,485,548 | 12/1984 | Janisiewicz | 29/566.3 |
| 4,570,336 | 2/1986 | Richter et al. | 29/838 |

FOREIGN PATENT DOCUMENTS 3318110 1/1985 Fed. Rep. of Germany .
2476964 8/1981 France .

Primary Examiner—Z. R. Bilinsky
Attorney, Agent, or Firm—John F. Moran

[57] ABSTRACT

The invention involves apparatus for equipping circuit boards with electronic components wherein the terminal pins of the components inserted into openings in the circuit board lying on an anvil. The anvil serves the purpose of severing and bending the terminal lugs by means of suitable cutting tools each consisting of a stationary and a movable knife. Monitoring devices are provided for the terminal pin ends protruding from the openings on the side of the circuit board opposite the components. According to the invention, there is assigned to each terminal pin (26, 27) a magnetic field-dependent sensor (151, 251), whose actuating magnet (131-140, 231) is movable over monitored. Preferably the individual push rods (101 to 110) are guided at a lateral distance between the movable knifes (7, 10; 17, 20), under spring pressure.

13 Claims, 3 Drawing Sheets 4,760,639

APPARATUS FOR EQUIPPING CIRCUIT BOARDS

BACKGROUND OF THE INVENTION

This invention relates to apparatus for equipping circuit boards with electronic components, and it relates, more particularly, to apparatus wherein the terminal pins of the components are inserted in openings in the circuit board lying on an anvil. The anvil serves the purpose of bending and severing the terminal lugs by means of suitable cutting tools each consisting of a stationary and a movable knife. In addition, the apparatus includes monitoring devices provided for the terminal pin ends protruding from the terminal openings on the side of the circuit board opposite the components.

When inserting, for example, four-to-forty pin integrated circuit components by automaic mounting machines, plugging errors may occur. The pins of the components are typically in the form of metal lugs that tend to stand individually outside their contacting hole region and bend while being inserted. This results in the undersired consequence of faulty contacting. Therefore it has heretofore been the general practice to subject all automatically mounted flat modules to a visual inspection after the inserting operation, testing in particular for pairing of the inserted pins per component.

To simplify the foregoing described visual inspection, recent practice has been to reproduce the terminal lugs on neutral paper by means of carbon paper and rubber press-on rolls, thereby simplifying the inspection. From German Patent Document DE-OS Pat. No. 33 18 110, there is disclosed apparatus for equipping circuit boards, to provide the respective anvil with an optical monitoring system for the terminal lug ends protruding from the openings on the side of the circuit board opposite the components. Besides it is also disclosed in German Patent Document DE-OS Pat. No. 33 40 147, which has also been filed here as a corresponding patent application and has matured into U.S. Pat. No. 4,570,336 issued on Feb. 18, 1986, to divide at least one of the knives into separate cutting tongues by parallel slits on the cutting edge side, each tongue associated with a strain gauge whose signals can be picked up in an evaluating unit.

The later device has the advantage that the pressing and bending forces acting during cutting against the stationary cutting areas generate, via the strain gauges associated with the cutting areas, an electrical signal for each terminal pin directly. This signal may be displayed on a display unit and can be evaluated accordingly. This method has proved successful in the practice already. The unavoidable trade-off is that the knives of the cutting tool must be replaced regularly and for each new knive the difficulties associated with applying, contacting and protecting the strain gauges must be heeded to prevent damage to the gauges.

SUMMARY OF THE INVENTION

In contrast to conventional practices, it is an object of the invention to provide apparatus of the first mentioned type which can be used independently of the tool to be replaced.

According to the principles of the present invention, the problem is solved in that with each terminal pin a magnetic field-dependent sensor is associated. The actuating magnet of the field-dependent sensor is movable over a push rod by bending and severing of the terminal lugs to be monitored. Preferably the individual push rods are guided within a lateral distance between the stationary and movable knives, under spring pressure.

In an illustrative embodiment of the invention, the push rods are directed by spring pressure into a position flush with the cutting edge of the stationary knife or a salient position. When a bending and/or cutting operation takes place, the terminal pin end of a component is pulled around the hole edge of the circuit board into an oblique position, whereby the push rod is pushed away in rearwardly fashion. This process continues until the projecting residule piece has been severed by the pinching cut.

A feature and advantage of the invention is that the parts used for the monitoring are not permanently connected with the exchangeable tool knives. Appropriately the movable knife has, on the side toward the fixed knife, grooves for guiding the push rods. In this arrangement, the fixed knife constitutes the upper knife while the movable knife serves as the lower knife of the cutting tool as is used in conventional practice.

As magnetic field-dependent sensors for the small stroke of the push rod movement, which may be in the range of about 0.4 to 0.8 mm, Hall generators or field plates may advantageously be used, which are actuated by generally cubically shaped or cuboid magnets disposed at the ends of the push rods. This results in signal patterns with zero crossing especially suitable for good reproducibility of preset switching points (forward break-over points). As a result of this characteristic such sensors in accordance with the invention are superior in particular to optical sensors. The zero crossing of the Hall voltage can be used for digitalization of the signals by means of matching amplifiers in a simple manner.

In accordance with the inventive principles, it is a further advantage that the push rods are bent in back and have attached to them the cuboid magnets at their upper end. A support unit for the magnets may be adjustably arranged on the back of the push rod. This makes it possible to preset the monitored zone of the magnet and Hall generator for each push rod.

In accordance with the inventive arrangement, it is now possible to change the upper knife as a standard replacement part. To change the lower knife, the push rods must be taken out each time.

BRIEF DESCRIPTION OF THE DRAWING

Further objects, features and advantages of the invention will be apparent from considering the following drawing figures and the description of illustrative embodiments, with reference to the accompanying drawing.

DETAILED DESCRIPTION

In the following drawing figures identical parts, or components, are designated with the same reference symbols. In particular in FIG. 1 and FIG. 2 only the parts necessary for understanding the present invention are discussed in detail.

Figure 1:
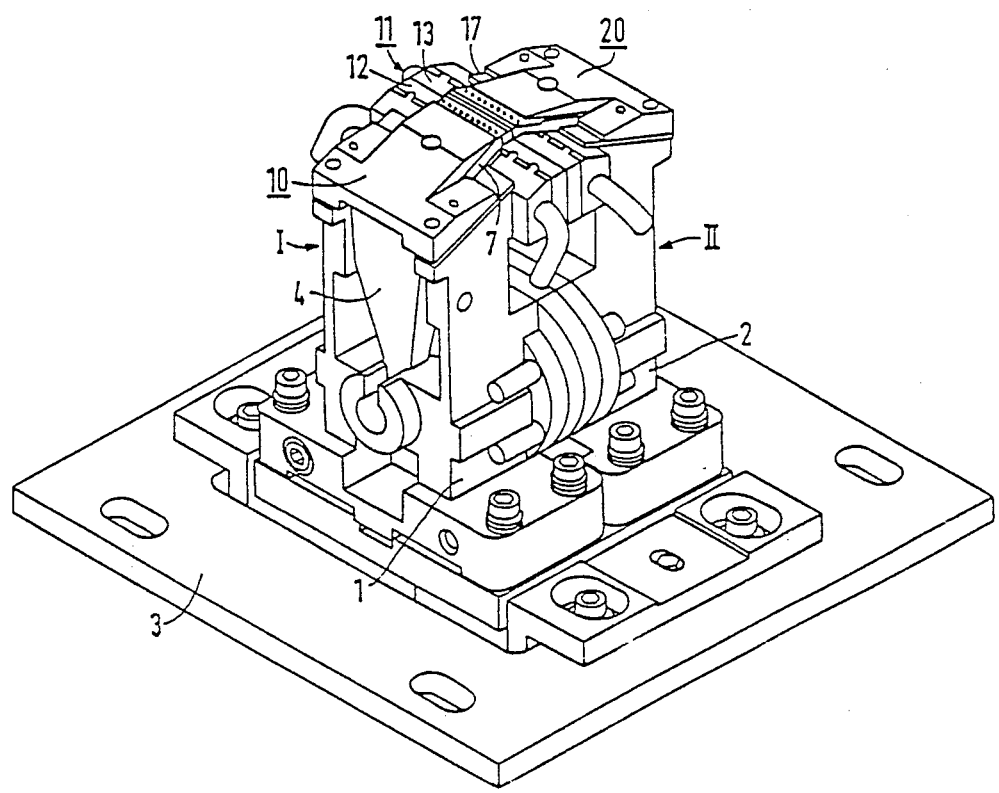
FIG. 1 is a perspective view of component mounting apparatus.
Figure 2:
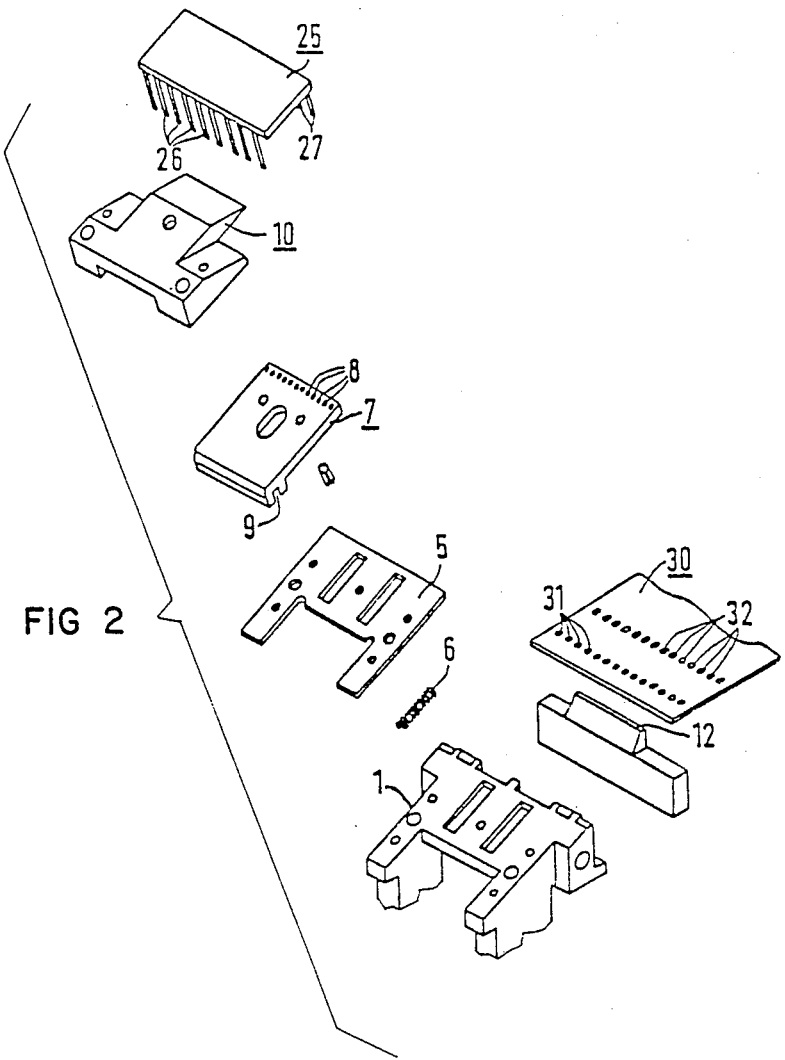
FIG. 2 is an exploded view of the tool of a conventional mounting machine.

FIG. 1 depicts a commercial mounting apparatus, including essentially two tool units I and II arranged in mirror symmetry, which will now be explained in detail. Holding jaws 1 and 2 are displaceably guided on a frame relative to a base plate 3. As is evident specifically from the exploded representation in FIG. 2, there are retained on the holding jaw 1, by way of an intermediate plate 5, a movable lower knife 7 and a stationary upper knife 10. Arranged in the intermediate plate 5 are springs 6 for resetting the movable knife 7. Specifically the knife 7 has apertures 8 for the feet (pins) of components. The knife 7 of FIG. 2 is actuated by a toggle lever 4 shown in FIG. 1 and which engages in a groove 9 in knife 7.

In cutting unit I, the details corresponding to parts 4 to 10 are marked 14 to 20, and in FIG. 1 the lower knives 7 and 17 can be seen under the upper knives 10 and 20. Between the two cutting tools, an anvil 11 is situated comprising portions 12 and 13 having inlet apertures as well as discharges for scrape metal pieces chips and the like. In FIG. 2, a typical IC component 25 is illustrated with many terminals, two rows of terminal pins 26 and 27 to be inserted into the respective rows of passage openings 31, 32 of a printed circuit board. In the conventional apparatus, the inserting operation is followed by automatic bending and severing of the terminal pins 26 and 27 designed as lugs.

Figure 3:
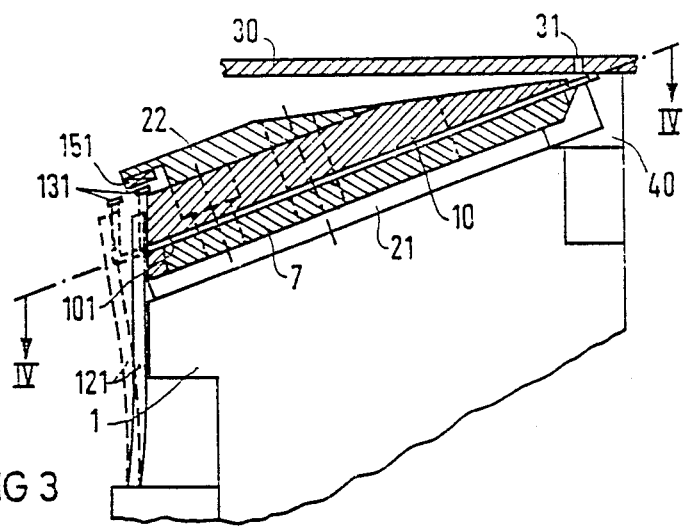
FIGS. 3 and 4 are, respectively, the side view and top view of a knife for a mounting machine according to the invention.

In FIG. 3, apparatus in the form of a cutting tool suitable for use in FIG. 1 depicted including a monitoring system for terminal lugs. Again reference numeral 1 denotes the holding jaw of the cutting apparatus, on which are arranged the movable lower knife 7 and the stationary upper knife 10. In addition, there is a sliding sheet 21 between the lower knife 7 and the holding jaw 1 and a bearing surface 40, which essentially correspond to the units 5 and 12 of FIG. 2. The entire arrangement is held together by screw unions, for which purpose a holding unit 22 is additionally applied above the upper knife 10, which unit can serve at the same time as a mount for monitoring means. The circuit board 30 to be equipped with components is present during mounting above this arrangment, one of the passage openings 31 being visible. The passage opening 31 lies above associated openings in the movable lower knife 7.

Between lower knife 7 and upper knife 10 push rods are disposed in a given lateral position, of which a single one is marked 101 in FIG. 3. The push rod 101 is guided by rod springs 121 in such a way that by its front end it terminates flush at the edge of the upper knife 10. As an alternative, the front ends may project beyond the upper knife 10. On the back, the push rod 101 is bent with a cuboid magnet 131 being applied at its upper end. Facing it there is on the lower side of the cover plate 22, in a corresponding cutout, a Hall generator 151, which may be activated by the cuboid magnet 131. Instead of Hall generators field plates may be used.

Figure 4:
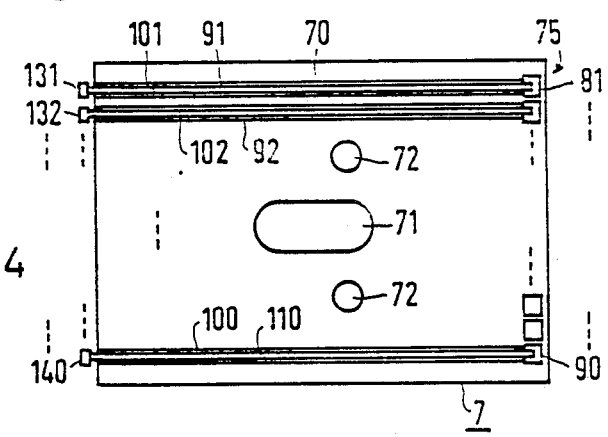

In the top view of the knife 7 as depicted in FIG. 4, it can be observed that for each of the terminal ends there is a corresponding arrangement consisting of a push rod, cuboid magnet and respective Hall generator. The surface of the knife is identified by reference numeral 70, in which cutouts 71 to 73 for the uptake of attachment means are cut. At the proximal edge 75, that is, opposite the cutting edge of the stationary upper knife 10, rows of cutouts 81 to 90 for the uptake of the terminal pins to be cut. Now according to the specific design arrangement of FIG. 3, parallel grooves 91 to 100, in which individual push rods 101 to 110 are guided, are cut in the cover face 70 of knife 7. On the back, the push rods 101 to 110 present the cuboid magnets 131 to 140.

In the arrangement described with reference to FIGS. 3 and 4, therefore, when the circuit boards are being equipped with components the bending and cutting process for the individual terminal pins is polled directly. The scanning of the individual terminal pins occurs via the push rods 101 to 110, which are machined (worked) in the movable knife 7. The push rods 101 to 110 are pushed forward by the rod springs 121 to 130 so far that they are flush with the cutting edge of the upper knife 10 or lie in front of it in a defined manner. When a bending/cutting process takes place, the lower knife 7 pulls the terminal pin end around the hole edge of the circuit board 30 into an oblique position, the respective push rod being pushed away rearwardly. This pushing away continues until the projecting residual piece of the terminal pin has been cut off by the pinch cut. When the cutting edge of the lower knife 7 itself pushes the push rod rearwardly, the measuring process is finished.

In the described arrangement, the movement of the individual push rods, which will be in the range of from 0.4 to 0.8 mm, is advantageously picked up by Hall generators, which are actuated by the magnet. The essential advantage of such a scanning consists in that signal patterns with zero crossing result, this being especially suitable for the good reproducibility of preset switching points. The zero crossing of the Hall voltage may be utilized for the digitalization of the signals by means of matching amplifiers in a simple manner.

Besides Hall generators or field plates also other magnetic field-dependent sensors can be used, provided they permit sufficient accuracy. Possibly also inductive displacement transducers may suitably serve this purpose. In particular as compared with optical sensors, it is advantage of the invention that dirt or the like is not able to produce measurement distortions. Thus a realistic monitoring device can be set up.

Figure 5:
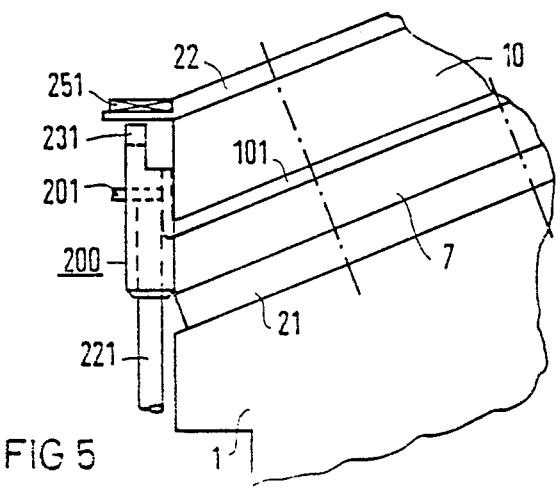
FIG. 5 is a side detailed view of a further illustrative embodiment in accordance with the invention and developed in accordance with its principles.

In FIG. 5 the arrangement according to FIG. 3 is developed slightly differently in that a presetting of the monitored zone for each push rod with magnet and associated Hall generator is made possible. Again 1 includes the holding jaw with a lower knife 7 disposed thereon above the sliding plate 21, a push rod 101 is fitted into a support means 200, which carries at its upper end an integrated cuboid magnet 231. Opposite it lies the holding plate 22 as support element with a field plate 251 present thereon, which may at the same time comprise also a printed circuit for the processing of the magnetic field-dependent voltages and generation of digital processing signals.

With the support means 200, the position of the cuboid magnet 231 may be adjusted for the push rod 101 separately. The rod spring 221 engages from below into the holding means and presses against the bent portion of the push rod 101. Through an adjusting screw 201 the relative position of the support means 200 is adjustable individually relative to the associated field plate 251 with cuboid magnet 131. By such an adjustment, a specific signal adaptation for each individual monitoring element may be provided accordingly.

In the foregoing described illustrative embodiments of the invention, it is advantageous that the monitoring elements do not influence the bending and cutting function of the cutting tools, as they are located outside the zone of action of the knife edges. To modify conventional mounting machines in accordance with the described invention, it is at least essential to machine into the lower knives of the cutting tool corresponding grooves for the push rods. This may be done in a cost-efficient manner by spark erosion techniques. In the operation of such an apparatus, the knives may readily be changed when they become blunt.

There has thus been shown and described novel apparatus associated with machine insertion of components into printed boards which fulfills all the objects and advantages sought therefor. Many changes, modifications, variations and other uses and applications of the subject invention will, however, become apparent to those skilled in the art after considering this specification and the accompanying drawing which disclose the preferred illustrative embodiments thereof. All such changes, modifications, variations and other uses and applications which do not depart from the spirit and scope of the invention are deemed to be covered by the invention which is limited only by the claims which follow.

I claim:

1. Apparatus for equipping circuit boards having predetermined apertures with electronic components having terminal pins that are inserted into selected apertures in the circuit board, the apparatus comprising: an anvil for supporting the circuit board; cutting means for bending and severing the terminal pins including a stationary knife and a movable knife; monitoring means for the terminal pin ends protruding from the apertures on a side of the circuit board, the monitoring means comprising a push rod for each terminal pin, the push rods occupying a plane parallel to the circuit board on the anvil, each push rod being moved while its terminal pin is being bent and being cut to length by the cutting means; a magnetic field-dependent sensor being associated with each terminal pin, an activation magnet associated with each terminal pin being secured to each push rod and being moved during the bending and cutting to length of the terminal pin; and the sensor detecting the movement of the activation magnet and producing an output for monitoring the movement of its associated push rod responsive to its terminal pin.

2. Apparatus according to claim 1, wherein springs mechanically bias the individual push rods and the push rods are moved between the stationary and movable knives a lateral distance.

3. Apparatus according to claim 1, wherein springs provide pressure on the push rods to maintain a position of rest that is flush with a cutting edge of the stationary knife.

4. Apparatus according to claim 1, wherein laterally displaced cutouts for guiding the movement of the push rods are located in the stationary knife and face toward the movable knife.

5. Apparatus according to claim 1, wherein the stationary knife comprises an upper knife and the movable knife comprises a lower knife of the cutting means.

6. Apparatus according to claim 1, further comprising cuboid magnets arranged in end position at the push rods and wherein the magnetic field-dependent sensors comprise Hall generators responsive to cuboid magnets.

7. Apparatus according to claim 1, further comprising cuboid magnets disposed at the end position at the push rods and wherein the magnetic field-dependent sensors comprise field plates which are responsive to the cuboid magnets.

8. Apparatus according to claim 7, wherein the push rods are bent a distance from a first end located at the terminal pin and include the cuboid magnets located at other end.

9. Apparatus according to claim 8, wherein a support unit for the magnets is adjustably located on the other end of the push rod.

10. Apparatus acording to claim 6, wherein the Hall generator is attached to a mount for the cutting tool as a changeable unit.

11. Apparatus according to claim 7, wherein the field plate is attached to a mount for the cutting tool as a changeable unit.

12. Apparatus according to claim 10, wherein the mount also forms a support of an evaluating circuit for the magnetic field-dependent signals.

13. Apparatus according to claim 11, wherein the mount serves a support of an evaluating circuit for the magnetic field-dependent signals.

* * * * *